(12) United States Patent
Ling et al.

(10) Patent No.: US 11,150,505 B2
(45) Date of Patent: Oct. 19, 2021

(54) DISPLAY PANEL AND DISPLAY DEVICE

(71) Applicant: XIAMEN TIANMA MICRO-ELECTRONICS CO., LTD., Xiamen (CN)

(72) Inventors: Ankai Ling, Xiamen (CN); Xuanxian Cai, Xiamen (CN); Binyi Zheng, Xiamen (CN); Boping Shen, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 197 days.

(21) Appl. No.: 16/433,918

(22) Filed: Jun. 6, 2019

(65) Prior Publication Data

US 2020/0209679 A1   Jul. 2, 2020

(30) Foreign Application Priority Data

Dec. 27, 2018  (CN) .......................... 201811610169.3

(51) Int. Cl.
| | |
|---|---|
| *G02F 1/1333* | (2006.01) |
| *G02F 1/1335* | (2006.01) |
| *G02F 1/1368* | (2006.01) |
| *H01L 27/12* | (2006.01) |
| *H01L 31/103* | (2006.01) |

(Continued)

(52) U.S. Cl.
CPC ...... *G02F 1/133526* (2013.01); *G02F 1/1368* (2013.01); *G02F 1/13338* (2013.01); *G02F 1/133512* (2013.01); *G02F 1/133514* (2013.01); *G06F 3/0412* (2013.01); *H01L 27/1214* (2013.01); *H01L 31/103* (2013.01); *H01L 31/12* (2013.01); *G02F 1/133357* (2021.01)

(58) Field of Classification Search
None
See application file for complete search history.

(56) References Cited

U.S. PATENT DOCUMENTS

| | | | |
|---|---|---|---|
| 2007/0182890 A1* | 8/2007 | Mizusako | G02F 1/133526 349/110 |
| 2009/0225538 A1* | 9/2009 | Horikoshi | G02F 1/1337 362/225 |
| 2019/0331948 A1* | 10/2019 | Zhang | B29C 64/264 |

FOREIGN PATENT DOCUMENTS

| | | |
|---|---|---|
| CN | 105868742 A | 8/2016 |
| CN | 106295527 A | 1/2017 |
| CN | 108983506 A | 12/2018 |

* cited by examiner

*Primary Examiner* — Thanh Nhan P Nguyen
(74) *Attorney, Agent, or Firm* — Anova Law Group, PLLC

(57) ABSTRACT

Display panel and display device are provided. The display panel includes: a first substrate, a second substrate, and a liquid crystal layer between the first substrate and the second substrate. The first substrate includes a first base substrate and an optical sensor disposed on the first base substrate. The second substrate includes a second base substrate, a black matrix disposed on the second base substrate, and a light collecting structure disposed on a side of the black matrix adjacent to the first substrate. The optical sensor and the light collecting structure overlap each other in a direction perpendicular to the display panel. The light collecting structure includes at least one transparent protrusion protruded along a direction perpendicular to a surface of the first or second substrate and from the second substrate to the first substrate. The light collecting structure has a refractive index larger than the liquid crystal layer.

18 Claims, 15 Drawing Sheets

(51) Int. Cl.
*H01L 31/12* (2006.01)
*G06F 3/041* (2006.01)

DISPLAY PANEL AND DISPLAY DEVICE

CROSS-REFERENCES TO RELATED APPLICATIONS

This application claims the priority of Chinese Patent Application No. CN201811610169.3, filed on Dec. 27, 2018, the entire contents of all of which are incorporated herein by reference.

FIELD OF THE DISCLOSURE

The present disclosure generally relates to the field of display technologies and, in particular, relates to a display panel and a display device.

BACKGROUND

With the development of display technology, functions of a display device are more and more abundant. The display device integrates various functions such as touch-control recognition, motion sensing and detection, and fingerprint recognition. The fingerprint recognition function can identify the fingerprint information of a user and then implement the corresponding function. Fingerprint recognition has high security and is favored by users.

A display device integrates an optical sensor in a display panel and uses the optical sensor to implement the fingerprint recognition function. However, constrained by the transmittance of the display panel, the volume of the optical sensor, etc., the optical sensor is difficult to receive sufficient light to recognize the fingerprint, resulting in lower accuracy of fingerprint recognition and lowering the user experience.

Therefore, there is a need to solve the technical problems in the art to provide a display panel and a display device with high accuracy of fingerprint recognition.

BRIEF SUMMARY OF THE DISCLOSURE

In one aspect, the present disclosure provides a display panel including: a first substrate, a second substrate, and a liquid crystal layer between the first substrate and the second substrate. The first substrate includes a first base substrate and an optical sensor disposed on the first base substrate. The second substrate includes a second base substrate, a black matrix disposed on the second base substrate, and a light collecting structure disposed on a side of the black matrix adjacent to the first substrate. The optical sensor and the light collecting structure overlap each other in a direction perpendicular to the display panel. The light collecting structure includes at least one transparent protrusion protruded along a direction perpendicular to a surface of the first or second substrate and from the second substrate to the first substrate. A refractive index of the light collecting structure is larger than a refractive index of the liquid crystal layer.

In another aspect, the present disclosure provides a display device including the display panel. The display panel includes a first substrate, a second substrate, and a liquid crystal layer between the first substrate and the second substrate. The first substrate includes a first base substrate and an optical sensor disposed on the first base substrate. The second substrate includes a second base substrate, a black matrix disposed on the second base substrate, and a light collecting structure disposed on a side of the black matrix adjacent to the first substrate. The optical sensor and the light collecting structure overlap each other in a direction perpendicular to the display panel. The light collecting structure includes at least one transparent protrusion protruded along a direction perpendicular to a surface of the first or second substrate and from the second substrate to the first substrate. A refractive index of the light collecting structure is larger than a refractive index of the liquid crystal layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
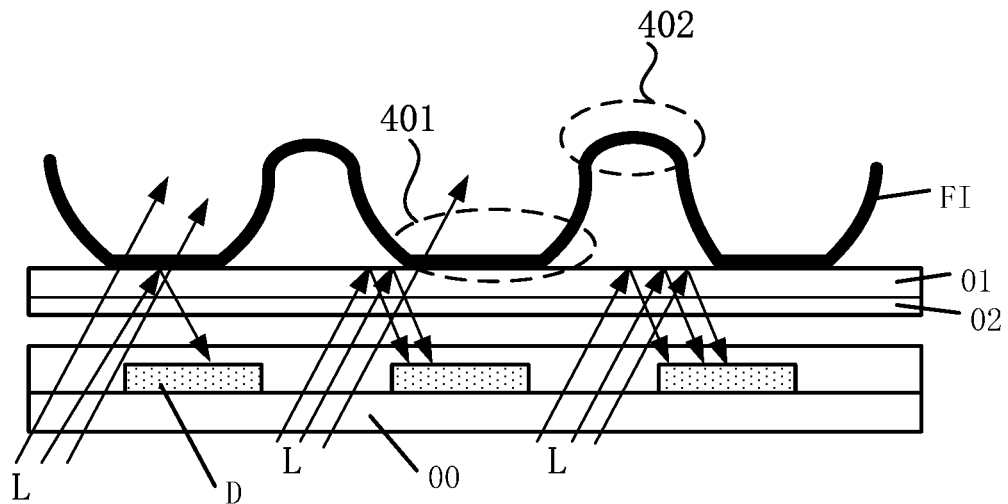
FIG. 1 is a schematic cross-sectional structural view of a display panel according to the prior art.

Various exemplary embodiments of the present disclosure are described in detail with reference to the drawings. It should be noted that the relative arrangement of components and steps, numerical expressions, and numerical values set forth in the exemplary embodiments are not intended to limit the scope of the present disclosure unless otherwise specified.

The following description of at least one exemplary embodiment is merely illustrative, and never in any way limits the present disclosure and its application or use.

Techniques, methods, and apparatus known to those skilled in the art may not be discussed in detail, but the techniques, the methods, and the apparatus should be considered as part of the present disclosure, where appropriate.

In all of the examples shown and discussed herein, any specific values are to be construed as illustrative only and not as a limitation. Thus, other examples of the exemplary embodiments may have different values.

It should be noted that similar reference numerals and letters indicate similar items in the following drawings, and therefore, once an item is defined in one drawing, it is not required to be further discussed in the subsequent drawings.

When an optical sensor is used in a display panel to implement the fingerprint recognition function, the recognition accuracy of the optical sensor is low. In order to improve the accuracy of fingerprint recognition, the inventors conducted the following research on the liquid crystal display panel of the prior art.

Referring to FIG. 1, a display panel provided by the prior art includes an optical sensor D, and the fingerprint recognition principle is as follows.

A fingerprint of a finger FI has ridges 401 and valleys 402. When the finger FI is pressed on the display panel, the ridges 401 are in contact with a surface of the display panel, and the valleys 402 are not in contact with the surface of the display panel, so that reflectance is different when light L is irradiated to the display panel corresponding to the valleys 402 and the ridges 401 of the fingerprint. Therefore intensity of reflected light received by the optical sensor D is different for reflected light formed at positions of the ridges 401 and reflected light formed at positions of the valleys 402, correspondingly, magnitude of photocurrent in the optical sensor D is different for photocurrent converted from the reflected light formed at the positions of the ridges 401 and the reflected light formed at the positions of the valleys 402. According to the magnitude of the photocurrent, the ridges and the valleys of the fingerprint can be identified, and magnitude of currents from multiple optical sensors D is integrated to identify the fingerprint information.

After reflected light of the light L passes through a polarizer 01 and a color resist 02, light intensity is greatly weakened, thereby affecting sensitivity of the optical sensor D and reducing the accuracy of the fingerprint recognition.

In order to solve the above technical problems, the present disclosure provides a display panel and a display device. Exemplary embodiments of the display panel and the display device provided by the present disclosure will be described in detail below.

Figure 2:
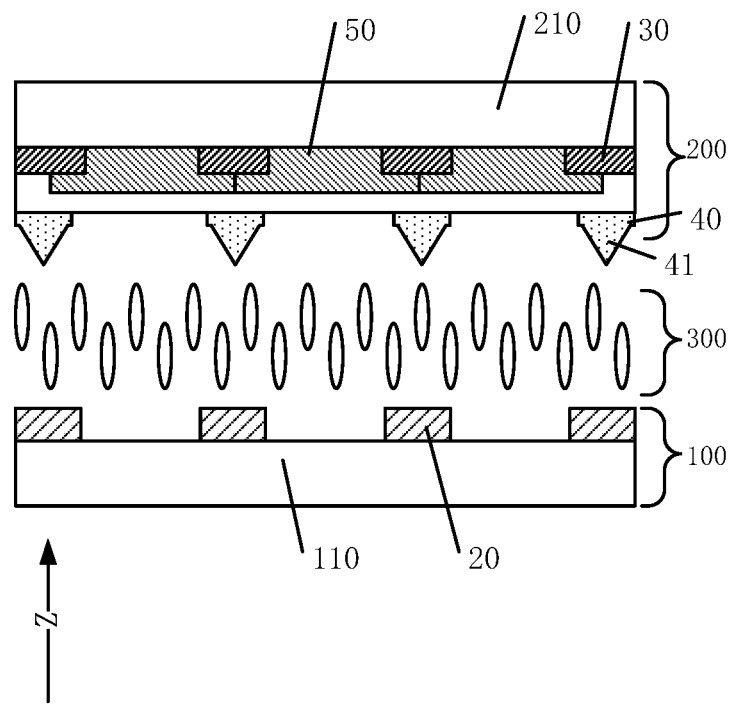
FIG. 2 is a schematic cross-sectional structural view of a display panel according to an exemplary embodiment of the present disclosure.

Referring to FIG. 2, FIG. 2 is a schematic cross-sectional structural view of a display panel according to an exemplary embodiment of the present disclosure.

One embodiment provides a display panel, including: a first substrate 100, a second substrate 200, and a liquid crystal layer 300 sandwiched between the first substrate 100 and the second substrate 200.

The first substrate 100 includes a first base substrate 110 and an optical sensor 20 disposed on the first base substrate 110.

The second substrate 200 includes a second base substrate 210, a black matrix 30 disposed on the second base substrate 210, and a light collecting structure 40 disposed on a side of the black matrix 30 adjacent to the first substrate 100.

The optical sensor 20 and the light collecting structure 40 overlap each other in a direction perpendicular to the display panel. The direction perpendicular to the display panel is direction Z shown in the drawing.

The light collecting structure 40 includes at least one transparent protrusion 41 protruded along a direction perpendicular to a surface of the first substrate 100 or the second substrate 200 and from the second substrate 200 to the first substrate 100.

A refractive index of the light collecting structure 40 is larger than a refractive index of the liquid crystal layer 300.

The display panel provided in one embodiment is a liquid crystal display panel, and includes the first substrate 100, the second substrate 200, and the liquid crystal layer 300. The first substrate 100 may be an array substrate, and the second substrate 200 may be a color film substrate. The liquid crystal layer 300 is sealed between the first substrate 100 and the second substrate 200.

The first substrate 100 includes the first base substrate 110, which is typically a transparent material to avoid affecting transmittance of light. The first base substrate 110 may be flexible, for example, made of a resin material, or may be hard, for example, made of a glass material, which is not specifically limited in one embodiment.

The first base substrate 110 is used to carry the optical sensor 20. Alternatively, in one embodiment, the optical sensor 20 is disposed on a side of the first base substrate 110 adjacent to the second substrate 200 only as an example. In other embodiments of the present disclosure, the optical sensor 20 may also be disposed on a side of the first base substrate 110 away from the second substrate 200, which is not specifically limited in one embodiment.

The optical sensor 20 is a photosensitive device that senses light and converts an optical signal into an electrical signal. Magnitude of the converted electrical signal varies with intensity of the light. The stronger the light, the larger the electrical current signal. The weaker the light, the smaller the electrical current signal.

The second substrate 200 includes a second base substrate 210, which is typically a transparent material to avoid affecting transmittance of light. The second base substrate 210 may be flexible, for example, made of a resin material, or may be hard, for example, made of a glass material, which is not specifically limited in one embodiment.

The black matrix 30 is disposed on the second base substrate 210. The black matrix has strong light absorbing capability, mainly preventing light leakage between pixels of the display panel (not shown), increasing contrast of color, and improving display effect. Optionally, a color resist layer 50 may be disposed on the second base substrate 210. The color resist layer 50 has a filtering effect. Optionally, the color resist layer 50 may include color resists of at least three different colors.

In order to increase sensitivity of the optical sensor 20, the display panel provided in one embodiment is provided with the light collecting structure 40. The light collecting structure 40 has a function of converging light, which can increase intensity of light irradiated to the optical sensor 20. For example, the light collecting structure includes at least one transparent protrusion 41 which is made of a material having a high light transmittance, corresponds to a convex lens, and has a function of converging light.

Figure 3:
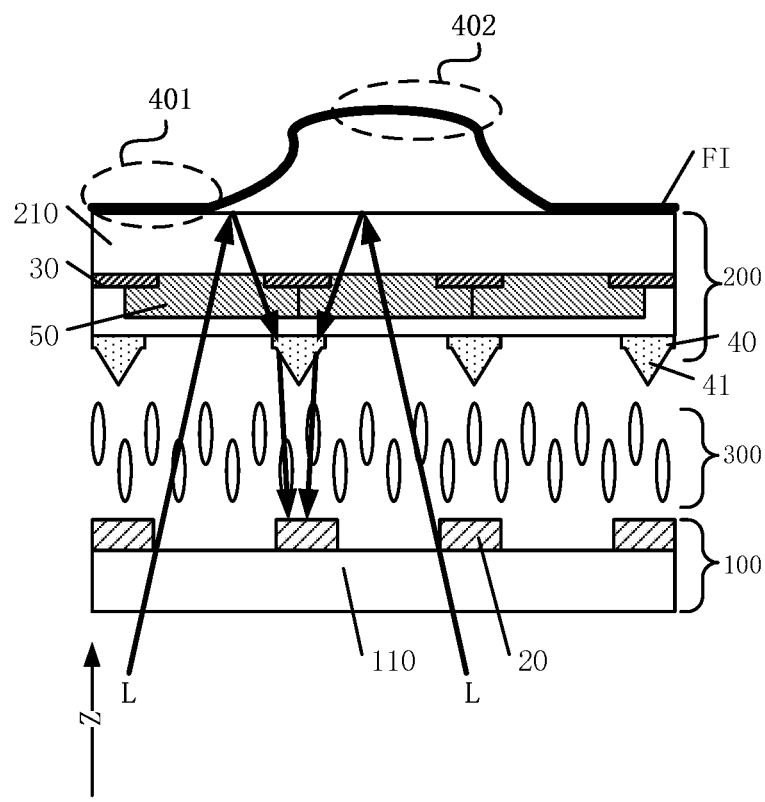
FIG. 3 is an optical path diagram of the display panel shown in FIG. 2 during fingerprint recognition.

For example, referring to FIG. 3, FIG. 3 is an optical path diagram of the display panel shown in FIG. 2 during fingerprint recognition. A fingerprint of a finger FI has ridges 401 and valleys 402. When the finger FI is pressed on the display panel, the ridges 401 are in contact with a surface of the display panel, and the valleys 402 are not in contact with the surface of the display panel. When light L is irradiated onto the surface of the display panel at the positions corresponding to the valleys 402, reflectance is high, and partially reflected light sequentially passes through the second base substrate 210 and the color resist layer 50, and then is irradiated to the light collecting structure 40. The light collecting structure 40 converges the light. Since the optical sensor 20 and the light collecting structure 40 overlap each other in the direction Z, that is, the optical sensor 20 is located below the light collecting structure 40 and in a light emitting direction of the light converged by the light collecting structure 40, thus the light converged by the light collecting structure 40 can be irradiated to the optical sensor 20, thereby increasing the intensity of the light that is incident on the optical sensor 20. The greater the intensity of the sensed light of the optical sensor 20, the more sensitive the optical sensor 20, the larger the corresponding converted current signal. A larger current signal facilitates reception and recognition, and can improve the accuracy of fingerprint recognition.

Figure 4:
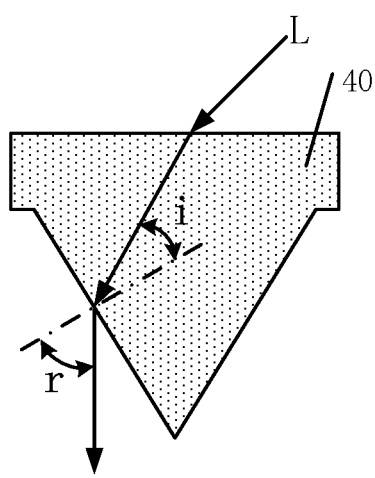
FIG. 4 is an optical path diagram of a light collecting structure in the display panel shown in FIG. 2.

In one embodiment, the refractive index of the light collecting structure 40 is set to be larger than the refractive index of the liquid crystal layer 300. In other words, the light collecting structure 40 is made of a medium with a higher refractive index, the liquid crystal layer 300 is made of a medium with a lower refractive index. When a ray of light is incident on a medium with a lower refractive index from a medium with a higher refractive index, the angle of refraction is larger than the angle of incidence. The angle at which the light is emitted from the light collecting structure 40 (that is, the angle of refraction) can be made larger and toward a direction in which the optical sensor 20 is located. For example, referring to FIG. 3 and FIG. 4 together, FIG. 4 is an optical path diagram in the light collecting structure of the display panel shown in FIG. 2. When light L is irradiated to a surface of the display panel corresponding to the valleys 402, reflectance is high. After sequentially passing through the second base substrate 210 and the color resist layer 50, part of reflected light is irradiated to the light collecting structure 40. When the reflected light is emitted from the light collecting structure 40, the angle of refraction r is greater than the angle of incidence i, so that the emitted light is directed toward the optical sensor 20, thereby facilitating the optical sensor 20 to receive more light. Optionally, the refractive index of the light collecting structure 40 is N1, and $1.4 \leq N1 \leq 1.9$. The refractive index of the liquid crystal layer 300 is usually less than 1.4, and a refractive index range of the light collecting structure 40 is set to be between about 1.4 and about 1.9. On the one hand, the refractive index of the light collecting structure 40 can be made larger than the refractive index of the liquid crystal layer 300, and on the other hand, the refractive index of the light collecting structure 40 should not be too large, and a refractive index more than 1.9 may make the angle of refraction too large, which is disadvantageous for being received by the optical sensor.

It should be noted that the light collecting structure 40 is disposed on the side of the black matrix 30 adjacent to the first substrate 100, so that light converged by the light collecting structure 40 can be prevented from being absorbed by the black matrix 30 after being emitted. Optionally, in the direction Z, the black matrix 30 covers the light collecting structure 40. Since the black matrix 30 has a function of absorbing light, no light is emitted from an area where the black matrix 30 is located. The light collecting structure 40 is disposed in a region where no light is emitted, so that the light collecting structure 40 can be prevented from affecting the normal light emission at other positions, thereby avoiding affecting transmittance of the display panel.

The display panel provided in one embodiment has at least the following beneficial effects.

The display panel includes a first substrate 100, a second substrate 200, and a liquid crystal layer 300 sandwiched between the first substrate 100 and the second substrate 200. An optical sensor 20 is disposed in the first substrate 100, and the optical sensor 20 is a photosensitive device that can convert an optical signal into an electrical signal. A black matrix 30 is disposed in the second substrate 200, and a light collecting structure 40 is disposed on a side of the black matrix 30 adjacent to the first substrate 100. The light collecting structure 40 has a function of converging light, and includes at least one transparent protrusion 41. The at least one transparent protrusion 41 is made of a material having a high light transmittance, and is equivalent to a convex len to converge the light, thereby increasing intensity of light that is incident on the optical sensor 20. The greater the intensity of the sensed light of the optical sensor 20, the more sensitive the optical sensor 20, and the larger the corresponding converted current signal. A larger current signal facilitates reception and recognition, which improves the accuracy of fingerprint recognition and improves user experience.

Figure 5:
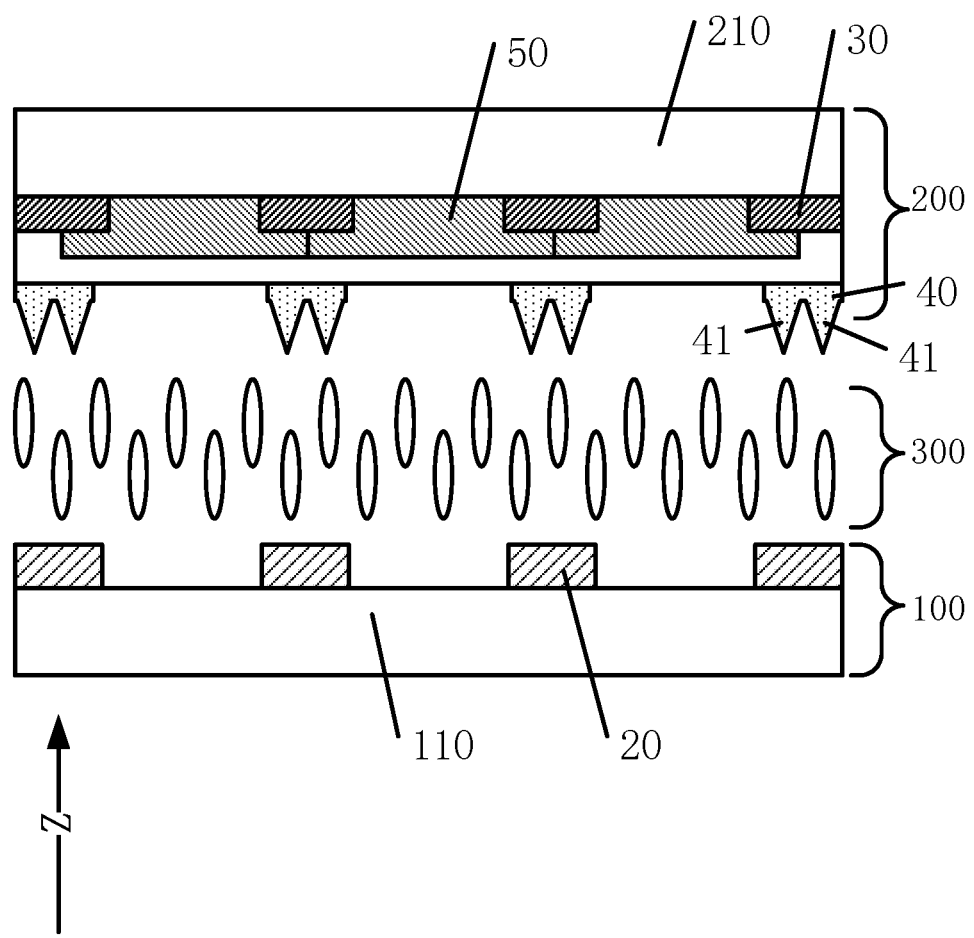
FIG. 5 is a schematic cross-sectional structural view of another display panel according to an exemplary embodiment of the present disclosure.

It should be noted that, in the display panel provided by one embodiment of the present disclosure, the light collecting structure includes at least one transparent protrusion 41, and FIGS. 2 and 3 only include one transparent protrusion 41 in the light collecting structure. Optionally, the number of the transparent protrusion 41 may be two. For example, referring to FIG. 5, FIG. 5 is a schematic cross-sectional structural view of another display panel according to an exemplary embodiment of the present disclosure. In other optional implementations of the present disclosure, the number of the transparent protrusion 41 may be three or more, and may be set according to factors such as the size of the light collecting structure 40 and the sensitivity of the optical sensor 20, and will not be further described in the embodiments of the present disclosure.

Figure 6:
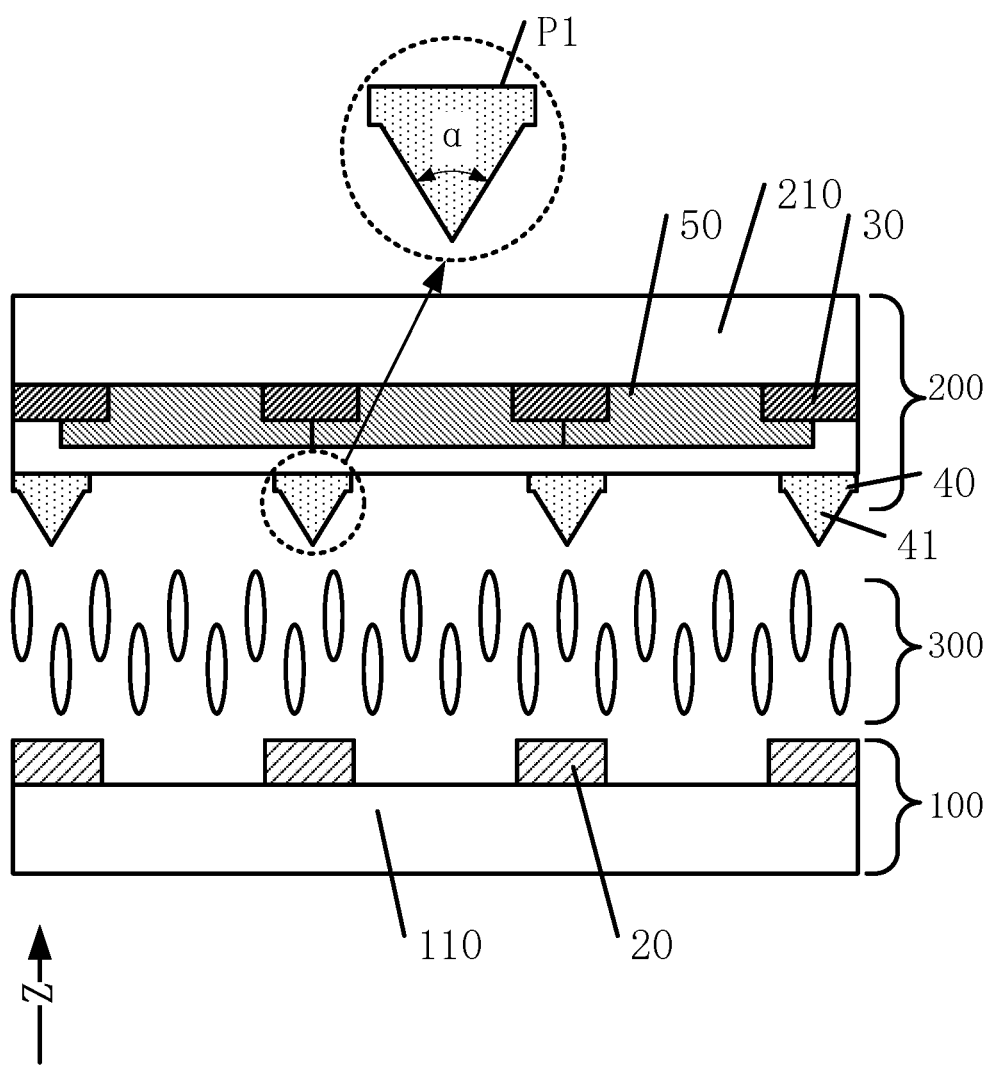
FIG. 6 is a schematic cross-sectional structural view of another display panel according to an exemplary embodiment of the present disclosure.
Figure 7:
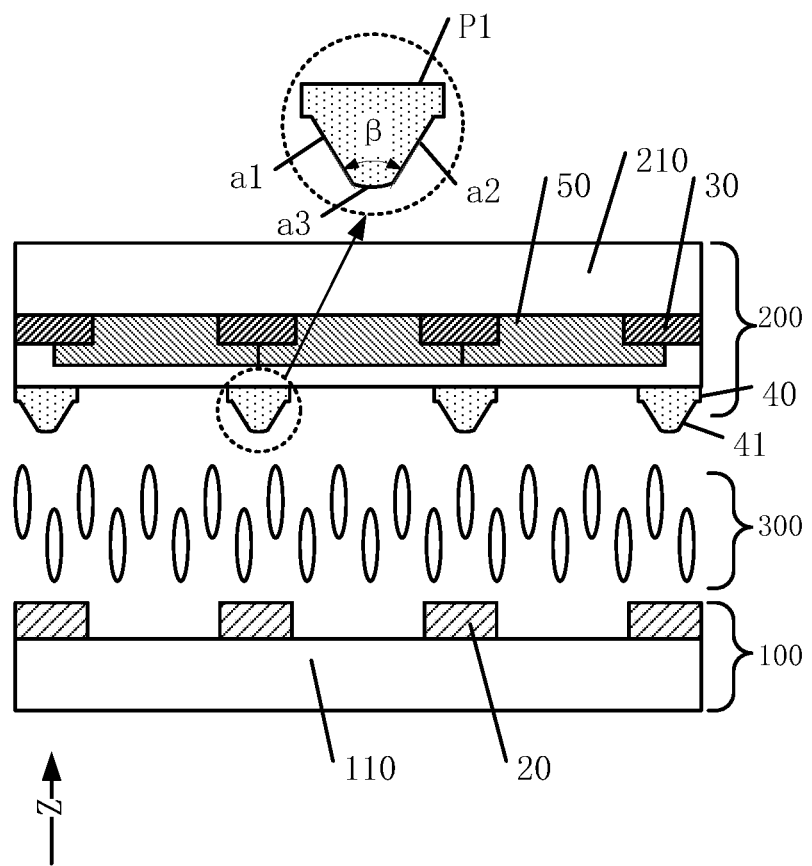
FIG. 7 is a schematic cross-sectional structural view of another display panel according to an exemplary embodiment of the present disclosure.

In another embodiment, referring to FIG. 6 or FIG. 7, FIG. 6 is a schematic cross-sectional structural view of another display panel according to one exemplary embodiment of the present disclosure and FIG. 7 is a schematic cross-sectional structural view of another display panel according to one exemplary embodiment of the present disclosure.

In one embodiment, a vertical cross-section of the transparent protrusion 41 is a first pattern P1, and the vertical cross-section is perpendicular to a surface of the second base substrate 210.

Referring to FIG. 6, the first pattern P1 includes a sharp corner, and the sharp corner or a rounded corner protrudes toward the first substrate 100. Referring to FIG. 7, the first pattern P1 can include a rounded corner, and the rounded corner protrudes toward the first substrate 100.

It should be noted that FIG. 6 and FIG. 7 illustrate the cross-sectional structure of the display panel, which is perpendicular to a surface of the second base substrate 210. Correspondingly, the vertical cross-section of the transparent protrusion 41 is illustrated in FIGS. 6 and 7. The vertical cross-section of the transparent protrusion 41 is a planar figure, that is, the first pattern P1. The first pattern P1 has a sharp corner or a rounded corner that is convex toward the first substrate 100. The shape of the sharp corner or the rounded corner facilitates the convergence of the light, and the reflected light enters the light collecting structure 40 and exits toward the optical sensor 20, thereby increasing the intensity of the light irradiated to the optical sensor 20 and improving the accuracy of fingerprint recognition.

In other embodiments, continuing to refer to FIG. 6, an angle of the sharp corner is $\alpha$, $70° \leq \alpha < 130°$.

In other embodiments, continuing to refer to FIG. 7, the rounded corner includes a first side a1, a second side a2, and an arc a3 connecting the first side a1 and the second side a2. An angle between the first side a1 and the second side a2 is $\beta$, $70° \leq \beta < 130°$.

It should be noted that the first pattern P1 may include a sharp corner or a rounded corner. The first pattern P1 is difficult to form an absolute sharp angle due to limitations in the manufacturing process and the like, and is generally a rounded structure in the actually manufactured product.

Hereinafter, in one embodiment of the present disclosure, a range of the angle $\alpha$ of the sharp angle will be described by taking the sharp angle of the first pattern P1 as an example.

Figure 8:
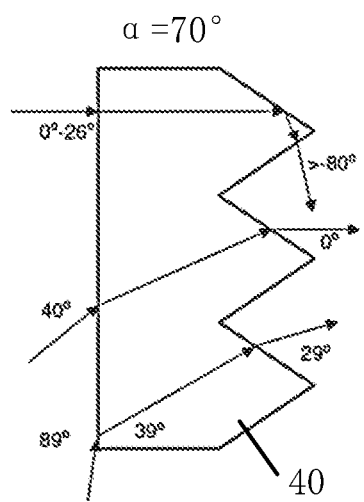
FIG. 8 is an optical path diagram of a light collecting structure in another display panel according to an exemplary embodiment of the present disclosure.
Figure 9:
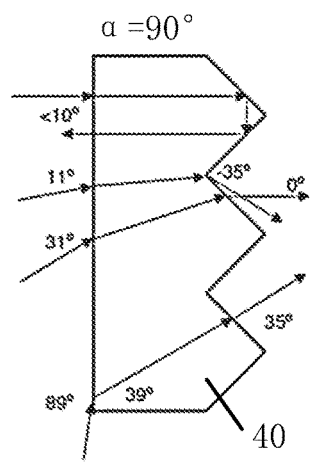
FIG. 9 is an optical path diagram of a light collecting structure in another display panel according to an exemplary embodiment of the present disclosure.
Figure 10:
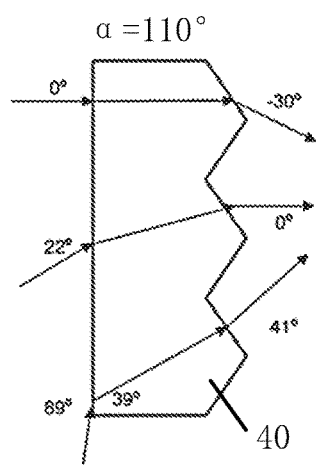
FIG. 10 is an optical path diagram of a light collecting structure in another display panel according to an exemplary embodiment of the present disclosure.

Referring to FIG. 8, FIG. 9 and FIG. 10, FIG. 8 is an optical path diagram of a light collecting structure in another display panel according to an exemplary embodiment of the present disclosure. FIG. 9 is an optical path diagram of a light collecting structure in another display panel according to an exemplary embodiment of the present disclosure. FIG. 10 is an optical path diagram of a light collecting structure in another display panel according to an exemplary embodiment of the present disclosure.

In FIG. 8, $\alpha = 70°$, when the incident angle of light is 0°-26°, the angle of emitted light after passing through the light collecting structure 40 is greater than −80°, which is disadvantageous for being received by the optical sensor. When the incident angle of the light is 40°-89°, the angle of the emitted light passing through the light collecting structure 40 is 0°-29°, and the emitted light in this range is favored to be received by the optical sensor.

In FIG. 9, $\alpha = 90°$, and when the incident angle of the light is less than 10°, total reflection occurs when the light enters the light collecting structure 40. When the incident angle of the light is 11°, the angle of the emitted light passing through the light collecting structure 40 is −35°, which is favorable for being received by the optical sensor. When the incident angle of the light is 31°-89°, the angle of the emitted light passing through the light collecting structure 40 is 0°-35°, and the emitted light in this range is favored to be received by the optical sensor.

In FIG. 10, $\alpha = 110°$, and when the incident angles of the light are 0°, 22°, and 89°, respectively, the angles of the emitted light after passing through the light collecting structure 40 are −30°, 0°, and 41°, respectively. The emitted light is all favored to be received by the optical sensor.

Referring to FIG. 8 through FIG. 10, it can be seen that the larger the angle $\alpha$, the more favorable it is to converge the light having a smaller incident angle into the emitted light which is favored to be received by the optical sensor. Accordingly, the light collecting structure 40 can effectively converge a large range of incident light to form an emitted light that is favored to be received by the optical sensor. Therefore, in one embodiment, the angle $\alpha$ is set to be greater than 70°. If the angle $\alpha$ is less than 70°, the angle range of incident light that the light collecting structure 40 can effectively converge is reduced. However, a should not be more than 130°. When it exceeds 130°, the converging effect of the light collecting structure 40 is deteriorated, and the emitted light is disadvantageous for being received by the optical sensor. When $\alpha = 110°$, the effect of converging light is relatively excellent.

It should be noted that, in FIG. 8, FIG. 9 and FIG. 10, the arrow of the emitted light points to the upper side of the figure, and the angle of the emitted light is positive; the arrow of the emitted light points to the lower side of the figure, and the angle of the emitted light is negative. The positive and negative values of the emitted light angle are only for distinguishing the direction of the emitted light. In one embodiment, when comparing the angular magnitudes, the absolute value of the emitted light angle is compared.

It should be noted that, in one embodiment shown in FIG. 7, when the length of the arc a3 is small, the rounded corner can be approximated to be a sharp angle, and the optical path diagram of the $\beta$ angle of the light collecting structure can refer to FIG. 8 through FIG. 10.

Figure 11:
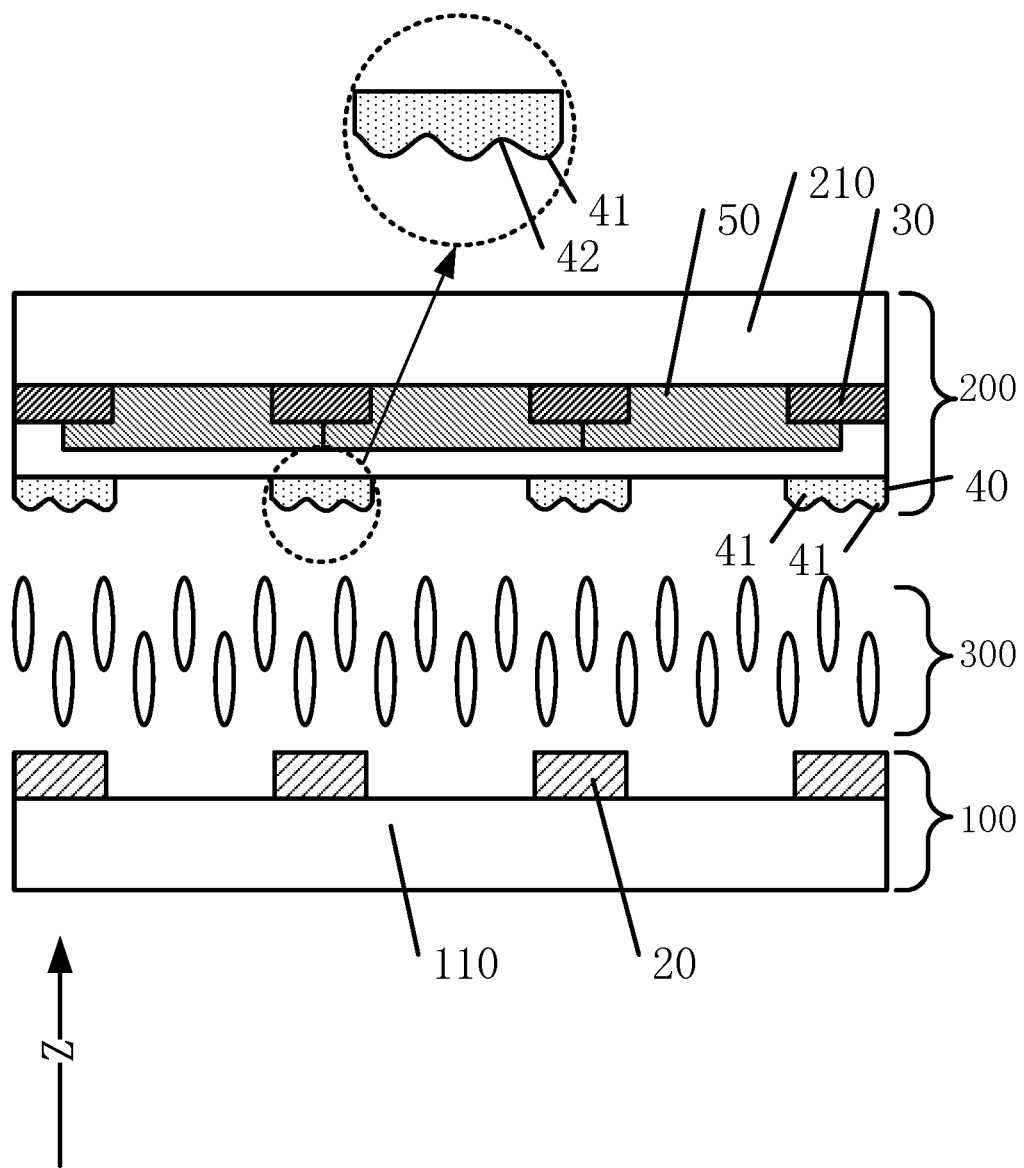
FIG. 11 is a schematic cross-sectional structural view of another display panel according to an exemplary embodiment of the present disclosure.

In other embodiments, referring to FIG. 11, FIG. 11 is a cross-sectional structural diagram of another display panel according to an exemplary embodiment of the present disclosure.

In one embodiment, the light collecting structure 40 includes a plurality of transparent protrusions 41, and a recess 42 is between two adjacent transparent protrusions of the plurality of transparent protrusions 41.

A surface of the transparent protrusion 41 is a convex surface, and a surface of the recess 42 is a concave surface.

For example, the transparent protrusion 41 is convex toward the first substrate 100, and the recess 42 is concaved toward inside of the light collecting structure 40. The surface of the transparent protrusion 41 and the surface of the recess 42 are curved structures, that is, a cross section of a side of the light collecting structure 40 facing the first substrate 100 shoves a wavy line.

In the display panel provided by one embodiment, a surface of the light collecting structure 40 facing the first substrate 100 is curved, the shape is easy to manufacture, the requirement to the process precision is low, and the process difficulty can be reduced.

It should be noted that FIGS. 6, 7, and 11 exemplarily describe a cross-sectional shape of the transparent protrusion 41. It is to be understood that the shape of the transparent protrusion in the practice of the present disclosure is not limited thereto.

Figure 12:
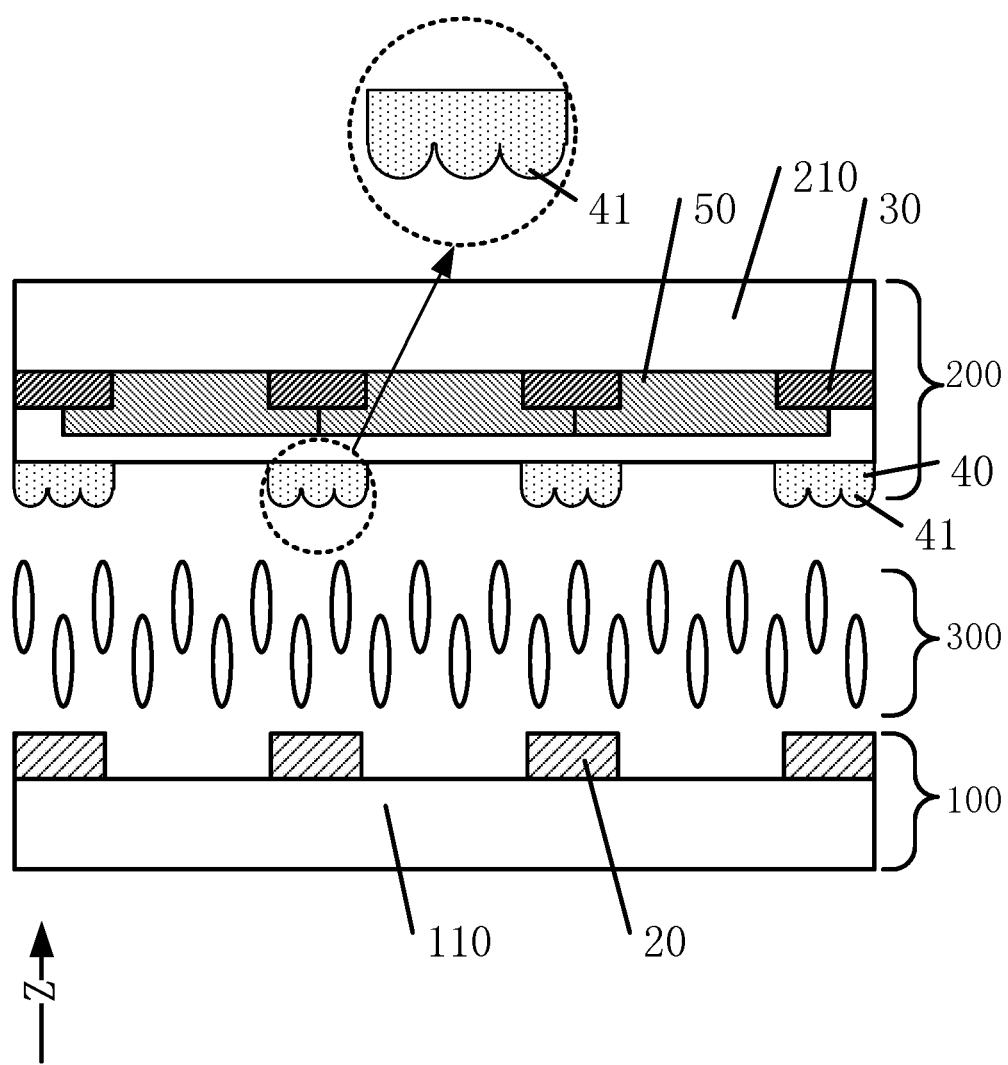
FIG. 12 is a schematic cross-sectional structural view of another display panel according to an exemplary embodiment of the present disclosure.

For example, referring to FIG. 12, FIG. 12 is a schematic cross-sectional view of another display panel according to an exemplary embodiment of the present disclosure. A side surface of a transparent protrusion 41 facing the first substrate 100 is spherical, that is, a cross section of the transparent protrusion 41 shown in FIG. 12 is an arc shape, and the transparent protrusion 41 is disposed in close proximity. It can be understood that, due to the limitation of the manufacturing process and the like, the transparent protrusion 41 generally has a transition surface having a concave curved shape, and the actually manufactured product usually has the structure shown in FIG. 11.

The shape of the transparent protrusion 41 can also be various shapes, for example, an irregular shape, or any other suitable shape.

It should be noted that in one embodiment shown in FIG. 6, the angle of the sharp corner is α, 70°≤α<130°. Embodiments shown in FIGS. 11 and 12 can be approximated as figures obtained by a large angle of α (e.g., α=150°). α should not be more than 130°, when it exceeds 130°, the light converging effect of the light collecting structure 40 is deteriorated, and the emitted light is disadvantageous for being received by the optical sensor. Therefore, in one embodiment shown in FIG. 6, 70°≤α<130°, and a same incident light has an excellent converging effect.

Figure 13:
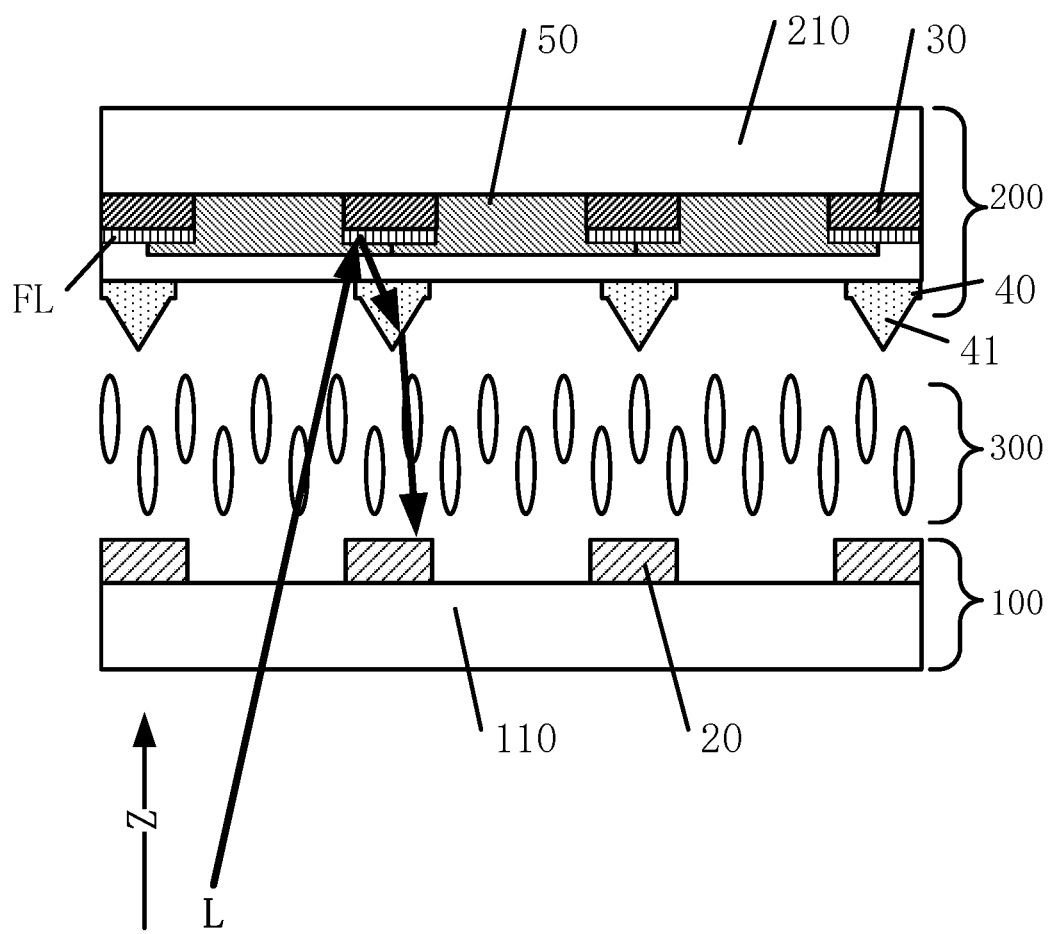
FIG. 13 is a schematic cross-sectional structural view of another display panel according to an exemplary embodiment of the present disclosure.

In other embodiments, referring to FIG. 13, FIG. 13 is a cross-sectional structural diagram of another display panel according to an exemplary embodiment of the present disclosure.

In one embodiment, a reflective layer FL is disposed on a surface of the black matrix 30 away from the second base substrate 210.

The reflective layer FL has a high reflectance for light. For example, it can be made of a metal material such as metallic silver. When the display panel is fabricated, a metal material may be coated on a surface of the black matrix after the black matrix is completed, and then patterned to form the reflective layer FL.

When fingerprinting is performed, part of the light L passes through the first substrate 100 and the liquid crystal layer 300, and is irradiated to the reflective layer FL. Part of the light reflected by the reflective layer FL is irradiated to the optical sensor 20, thereby further increasing the light to the optical sensor 20, improving the accuracy of fingerprint recognition, and improving user experience.

Figure 14:
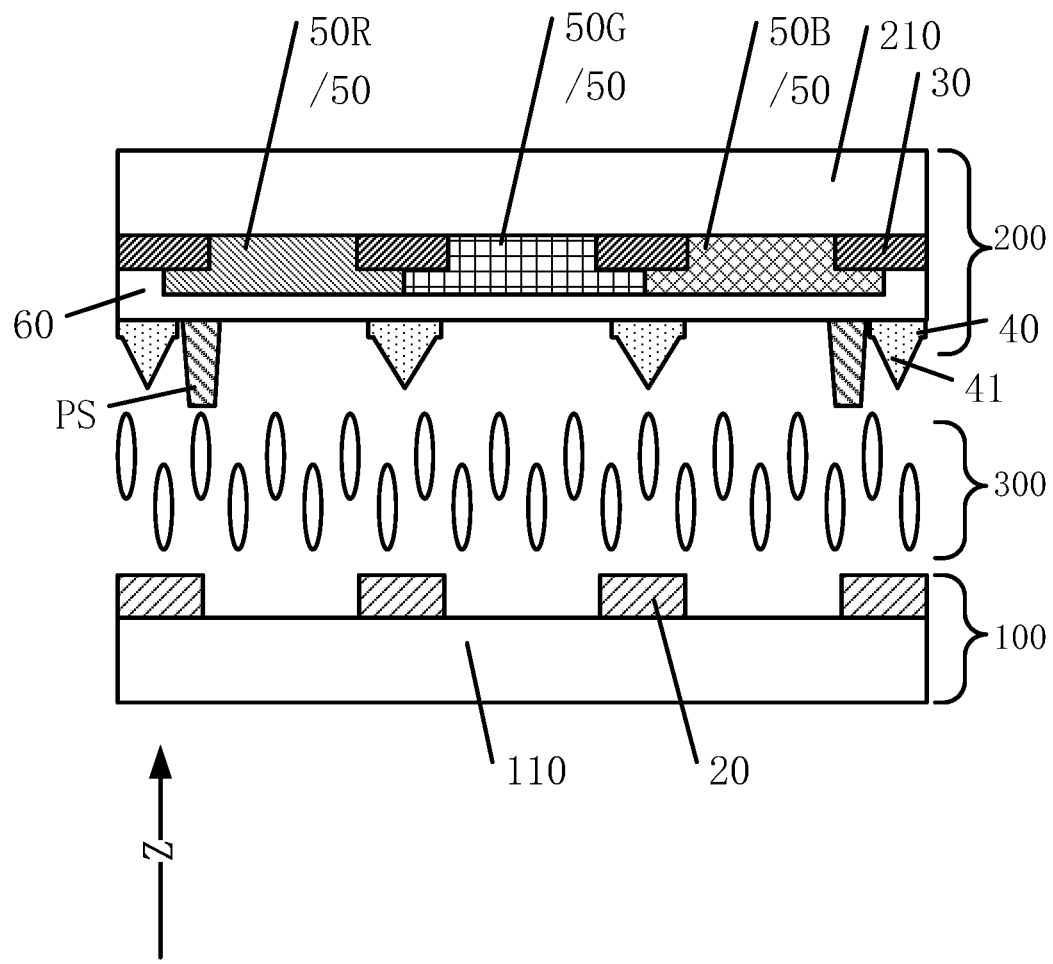
FIG. 14 is a schematic cross-sectional structural view of another display panel according to an exemplary embodiment of the present disclosure.

In other embodiments, referring to FIG. 14, FIG. 14 is a cross-sectional structural diagram of another display panel according to an exemplary embodiment of the present disclosure.

In one embodiment, the second substrate 200 further includes a color resist layer 50 and an insulating layer 60. The color resist layer 50 is located on a side of the black matrix 30 adjacent to the first substrate 100, and the insulating layer 60 is located between the light collecting structure 40 and the color resist layer 50.

Optionally, the color resist layer 50 includes a red color resist block 50R, a green color resist block 50G, and a blue color resist block 50B.

On the one hand the insulating layer 60 has insulating properties and can protect the color resist 50 and the black matrix 30 on the other hand, the insulating layer 60 can smooth the step formed by the color resist 50 and the black matrix 30. The insulating layer 60 may be made of an organic material or an inorganic material, which is not specifically limited in this embodiment.

Optionally, referring to FIG. 14, the second substrate 200 further includes a plurality of support pillars PS disposed on a side of the black matrix 30 adjacent to the first substrate 100. The light collecting structure 40 and the plurality of support pillars PS are made of a same material and are located on a same film layer. Optionally, the plurality of support pillars PS is located on a side of the insulating layer 60 adjacent to the first substrate 100.

In one embodiment, the light collecting structure 40 can be fabricated in a same process as the plurality of support pillars PS. For example, in a process of manufacturing the display panel, the light collecting structure 40 and the plurality of support pillars PS may be simultaneously formed by patterning a same material layer. The display panel provided in one embodiment is advantageous for reducing manufacturing process of the display panel and reducing cost.

Figure 15:
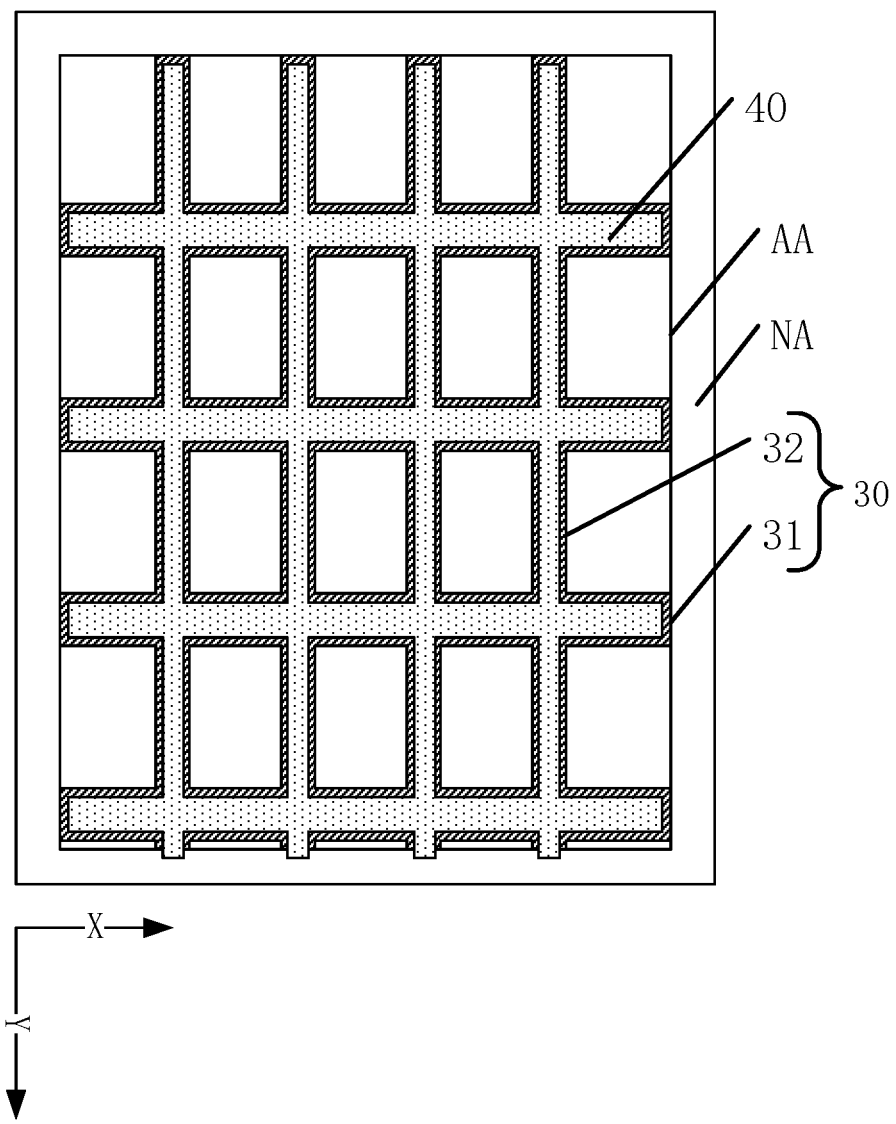
FIG. 15 is a schematic plan view showing a second substrate of another display panel according to an exemplary embodiment of the present disclosure.

In other embodiments, referring to FIG. 15, FIG. 15 is a schematic plan view showing a second substrate of another display panel according to an exemplary embodiment of the present disclosure.

In one embodiment, the display panel includes a display area AA and a non-display area NA surrounding the display area AA, and a portion of the black matrix 30 in the display area AA is a grid shape.

The black matrix 30 includes a plurality of first portions 31 extending in a first direction X, and a plurality of second portions 32 extending in a second direction Y. The plurality of first portions 31 and the plurality of second portions 32 intersect.

Optionally, an orthographic projection of the light collecting structure 40 on the second base substrate 210 is a grid shape.

It is to be noted that FIG. 15 is a view obtained by observing the second substrate in a direction perpendicular to a surface of the second base substrate 210, and thus, in FIG. 15, an orthographic projection of the light collecting structure 40 on the second base substrate 210 overlaps the light collecting structure 40, and the orthographic projection of the light collecting structure 40 on the second base substrate 210 is not otherwise illustrated in FIG. 15.

In one embodiment, the light collecting structure 40 is arranged in a grid shape to increase the orthographic projection area of the light collecting structure 40, so that the light collecting structure can collect reflected light from more positions, which is advantageous for increasing the light that is irradiated to the optical sensor, improving the accuracy of fingerprint recognition, and enhancing user experience.

Alternatively, an orthographic projection of the black matrix 30 on the second base substrate 210 completely covers the orthographic projection of the light collecting structure 40 on the second base substrate 210. In other words, the orthographic projection of the light collecting structure 40 on the second base substrate 210 is located within the orthographic projection range of the black matrix 30 on the second base substrate 210. It should be noted that the orthographic projection of the black matrix 30 on the second base substrate 210 overlaps its own range, and the orthographic projection of the black matrix 30 on the second base substrate 210 is not separately illustrated in FIG. 15.

In one embodiment, the light collecting structure 40 is disposed in the region where the black matrix is located, which can prevent the light collecting structure 40 from affecting the normal light emission in the opening region of the display panel, thereby avoiding affecting transmittance of the display panel.

Figure 16:
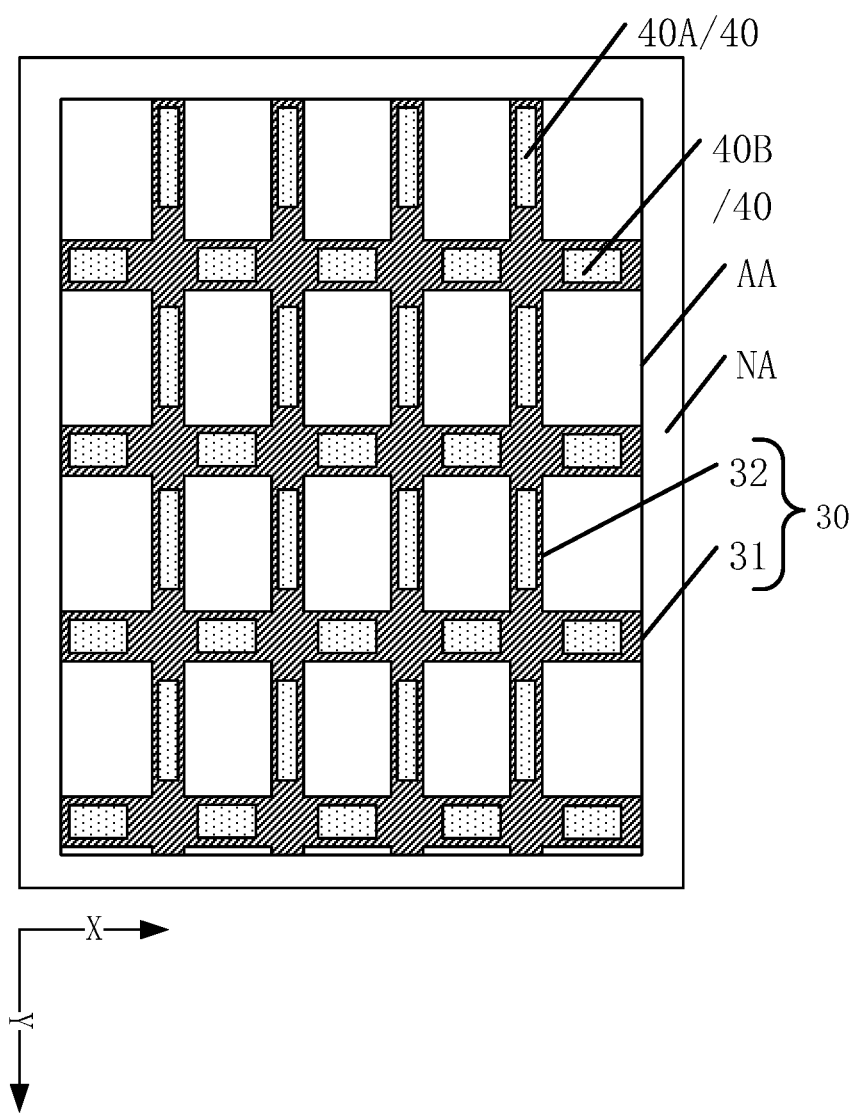
FIG. 16 is a schematic plan view showing a second substrate of another display panel according to an exemplary embodiment of the present disclosure.

In other embodiments, referring to FIG. 16. FIG. 16 is a schematic plan view of a second substrate of another display panel according to an exemplary embodiment of the present disclosure.

In one embodiment, a plurality of the light collecting structures 40 is provided, and an orthographic projection of the light collecting structure 40 on the second base substrate 210 is a strip shape.

The orthographic projection of the light collecting structure 40 on the second base substrate 210 extends in a first direction X or in a second direction Y.

In the display panel provided in one embodiment, specific number of the plurality of light collecting structures 40 can be set according to the actual requirements of the display panel, and each of the plurality of light collecting structures 40 is an independent structure. An orthographic projection of a light collecting structure 40B on the second base substrate 210 may be a strip shape extending in the first direction X, or an orthographic projection of a light collecting structure 40A on the second base substrate 210 may be a strip shape in the second direction Y.

It should be noted that, in some embodiments, orthographic projections of light collecting structures in the display panel on the second base substrate 210 may all be strip shapes extending in the first direction X. In other embodiments, orthographic projections of the light collecting structures of the display panel on the second base substrate 210 may all be strip shapes extending in the second direction Y. In other embodiments, as shown in FIG. 16, orthographic projections of some light collecting structures of the display panel on the second base substrate 210 are strip shapes extending in the first direction X, and orthographic projections of the other light collecting structures on the second base substrate 210 are strip shapes extending in the second direction Y. It can be understood that specific number and density of the light collecting structures can be set according to the actual situation of the display panel, which is not specifically limited in this embodiment.

In the display panel provided in one embodiment, each light collecting structure is an independent structure, and may make space for another structure in the display panel. For example, when the light collecting; structures and the support pillars PS are disposed in a same layer, each light collecting structure as an independent structure can make space for the support pillars PS to prevent the light collecting structures from affecting the normal setting of the support pillars PS.

Hereinafter, an exemplary embodiment of the present disclosure will be described with respect to a specific structure of an optical sensor.

Figure 17:
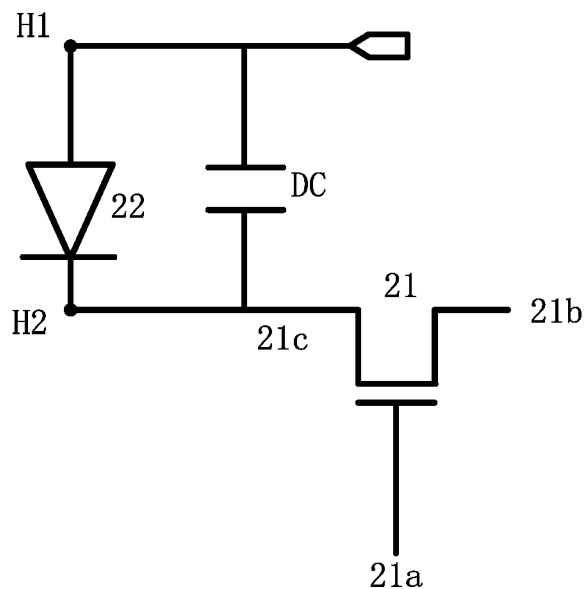
FIG. 17 is a schematic diagram showing a circuit structure of an optical sensor in another display panel according to an exemplary embodiment of the present disclosure.

In some embodiments, referring to FIG. 17, FIG. 17 is a schematic structural diagram of a circuit of an optical sensor in another display panel according to an exemplary embodiment of the present disclosure.

In one embodiment, an optical sensor 20 includes a first switch 21 and a photodiode 22, and the first switch 21 and the photodiode 22 are electrically connected.

Optionally, a gate 21a of the first switch 21 receives a control signal for controlling whether the first switch is turned on or off. A first terminal 21b of the first switch 21 receives a voltage signal.

Optionally, the optical sensor 20 further includes a capacitor DC. One electrode of the capacitor DC is electrically connected to a second terminal 21c of the first switch 21, and the other electrode is electrically connected to the photodiode 22.

Hereinafter, the present disclosure will be described in detail with respect to the exemplary fingerprint recognition principle of the optical sensor 20. In the fingerprint recognition phase, a node H1 inputs a low voltage signal, and the first terminal 21b of the first switch 21 receives a high voltage signal.

The entire fingerprint identification phase includes a preparation phase, a fingerprint signal acquisition phase, and a fingerprint signal detection phase.

In the preparation phase, a control signal of the gate 21a of the first switch 21 controls the first switch 21 of the optical sensor 20 to be turned on, and the capacitor DC is charged until the charging of the capacitor DC is completed.

In the fingerprint signal acquisition phase, the first switch 21 controlling the optical sensor 20 is turned off. When a user presses a finger on the display panel, light irradiates to the finger and reflects on a surface of the finger fingerprint to form reflected light. The reflected light formed by the finger fingerprint reflection is incident on the optical sensor 20, and is received by the photodiode 22 of the optical sensor 20, to form a photocurrent with a direction from a node H2 to the node H1, thereby causing the potential of the node H2 to change.

In the fingerprint signal detection phase, the amount of potential change of the node H2 can be directly detected, thereby determining magnitude of the photocurrent. In the fingerprint signal detection phase, the first switch 21 of the optical sensor 20 can also be controlled to be turned on. At this time, there is a potential difference between the two electrodes of the capacitor DC, and the capacitor DC is in a charging state. The amount of charge charged by the capacitor DC can be detected to determine the magnitude of the photocurrent.

In the following, embodiments of the present disclosure are exemplified herein for specific locations of an optical sensor.

Figure 18:
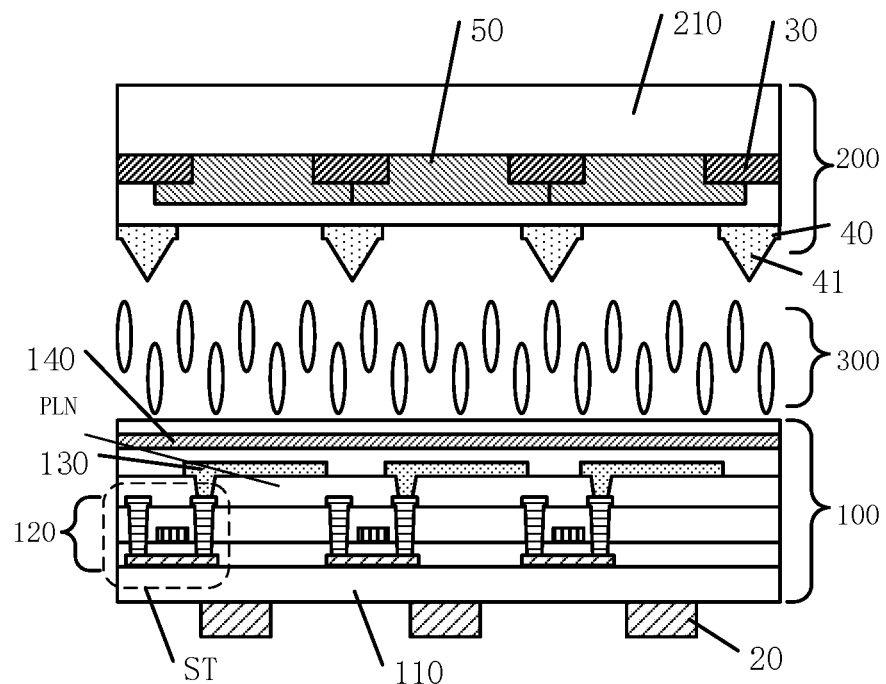
FIG. 18 is a schematic cross-sectional structural view of another display panel according to an exemplary embodiment of the present disclosure.

Referring to FIG. 18, FIG. 18 is a cross-sectional structural diagram of another display panel according to an exemplary embodiment of the present disclosure.

The first substrate 100 further includes: an array layer 120 disposed on a side of the first base substrate 110 adjacent to the second substrate 200, a planarization layer PLN, a pixel electrode layer 130, and a common electrode layer 140. The array layer 120 includes a plurality of thin film transistors ST.

An optical sensor 20 is located on a side of the first base substrate 110 away from the second substrate 200.

In one embodiment, the first substrate 100 is an array substrate. The array layer 120 may be provided with signal traces (not shown) in addition to the plurality of thin film transistors ST. The planarization layer PLN generally includes an organic material to smooth out the step formed by the plurality of thin film transistors ST. In FIG. 18, an embodiment in which the pixel electrode layer 130 is located on a side of the common electrode layer 140 adjacent to the first base substrate 110 is illustrated. Alternatively, the common electrode layer 140 may also be located on a side of the pixel electrode layer 130 adjacent to the first base substrate 110.

In the display panel provided in one embodiment, the optical sensor 20 is disposed on a side of the first base substrate 110 away from the second substrate 200, and the optical sensor 20 is fabricated after the film layers on the side of the first base substrate 110 adjacent to the second substrate 200 are completed. So that the manufacturing process of the array layer 120, the planarization layer PLN, the pixel electrode layer 130, and the common electrode layer 140 don't need to be changed, which is advantageous for reducing the manufacturing cost of the display panel.

Figure 19:
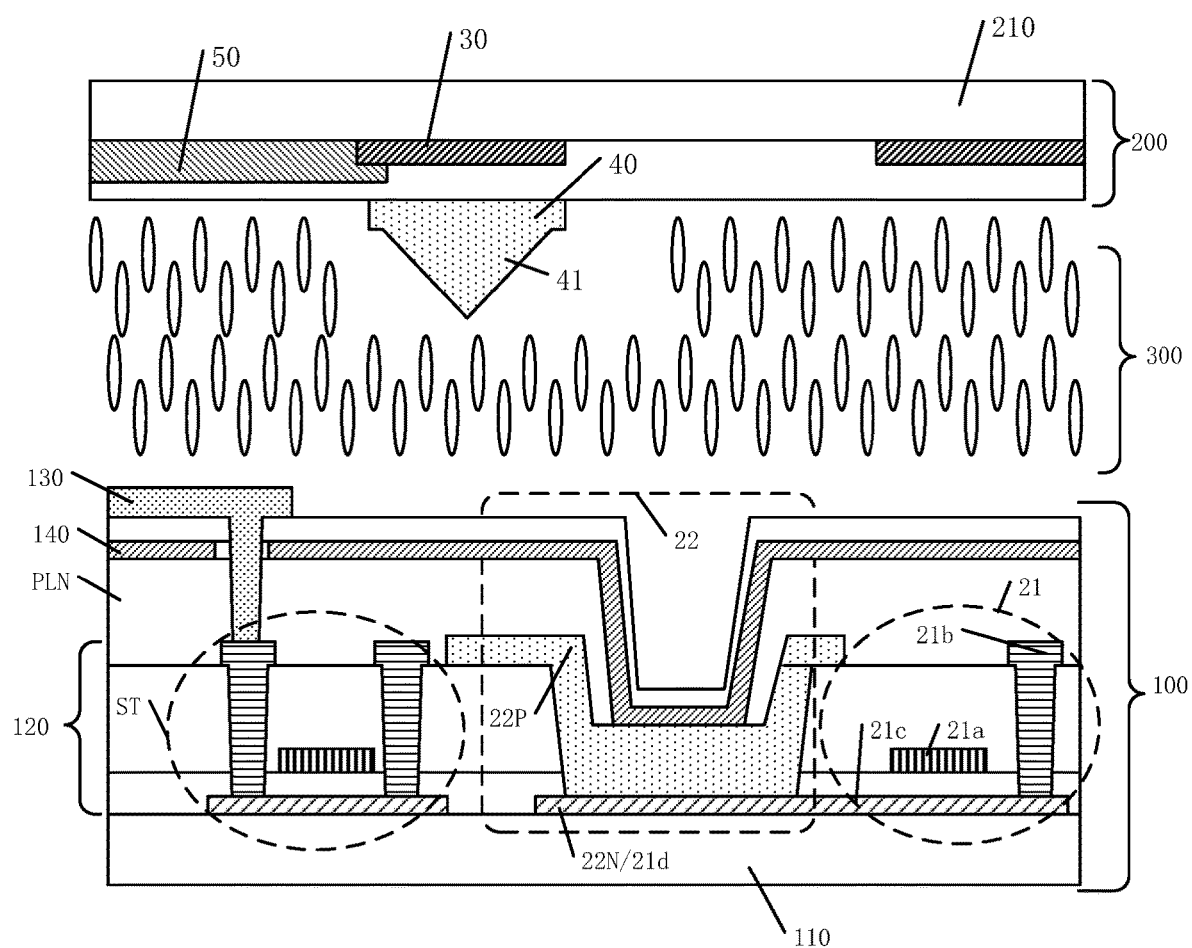
FIG. 19 is a schematic cross-sectional structural view of another display panel according to an exemplary embodiment of the present disclosure.

In other embodiments, referring to FIG. 19, FIG. 19 is a cross-sectional structural diagram of another display panel according to an exemplary embodiment of the present disclosure.

The first substrate 100 further includes: an array layer 120 disposed on a side of the first base substrate 110 adjacent to the second substrate 200, a planarization layer PLN, a pixel electrode layer 130, and a common electrode layer 140. The array layer 120 includes a plurality of thin film transistors ST.

An optical sensor 20 includes: a first switch 21 and a photodiode 22. The first switch 21 is located in the array layer 120. The photodiode 22 includes a PN junction, and the PN junction includes an N-type semiconductor region 22N and a P-type semiconductor region 22P.

An active layer 21*d* of the first switch 21 is multiplexed into the N-type semiconductor region 22N. The P-type semiconductor region 22P is located on a side surface of the N-type semiconductor region 22N away from the first base substrate 110.

In one embodiment, the first substrate 100 is an array substrate, and a plurality of thin film transistors ST is disposed in the array layer 120. In one embodiment, only one of the plurality of thin film transistors ST is illustrated to illustrate the film structure of the first substrate 100. It is to be understood that the specific number of the plurality of thin film transistors ST needs to be set according to the actual requirements of the display panel, which is not specifically limited in this embodiment.

In one embodiment, the optical sensor 20 includes the photodiode 22, and the core component of the photodiode 22 is the PN junction. The PN junction is formed by closely contacting an N-type doping region (i.e., the N-type semiconductor region 22N) and a P-type doping region (i.e., the P-type semiconductor region 22P). The PN junction has photosensitive properties and has unidirectional conductivity. When there is no light, the PN junction has a small saturated reverse leakage current, that is, a dark current, at which time the photodiode is turned off. When exposed to light, the saturated reverse leakage current of the PN junction is greatly increased, to form a current. The current strength varies with the intensity of the incident light.

The optical sensor 20 further includes the first switch 21 including a gate 21*a*, a source 21*b*, a drain 21*c*, and the active layer 21*d*. The active layer 21*d* is lengthened and multiplexed into the N-type semiconductor region 22N of the PN junction. For example, the active layer 21*d* is extended to a side of the P-type semiconductor region 22P close to the first base substrate 110 and electrically connected to the P-type semiconductor region 22P, thereby reducing the process for fabricating the optical sensor and facilitating the thinness of the display panel. Moreover, the first switch 21 is located on the array layer 120 and can be fabricated simultaneously with the plurality of thin film transistors ST, which can further reduce the process for fabricating the optical sensor. Optionally, the common electrode layer 140 and the P-type semiconductor region 22P are electrically connected for supplying a voltage signal to the PN junction.

The display panel provided in one embodiment integrates the optical sensor 20 in the first substrate, which is beneficial to reduce the process of the display panel. It also contributes to the thinness of the display panel. Moreover, the optical sensor 20 is located on a side of the first base substrate 110 close to the second substrate 200, and is closer to the light collecting structure 40, which is favorable for receiving the light emitted from the light collecting structure 40, and reducing the loss during transmission of the light emitted from the light collecting structure 40, thereby increasing the light received by the optical sensor 20, improving the accuracy of fingerprint recognition, and improving the user experience.

One embodiment of the present disclosure further provides a display device, including the display panel provided by any of the above embodiments of the present disclosure.

Figure 20:
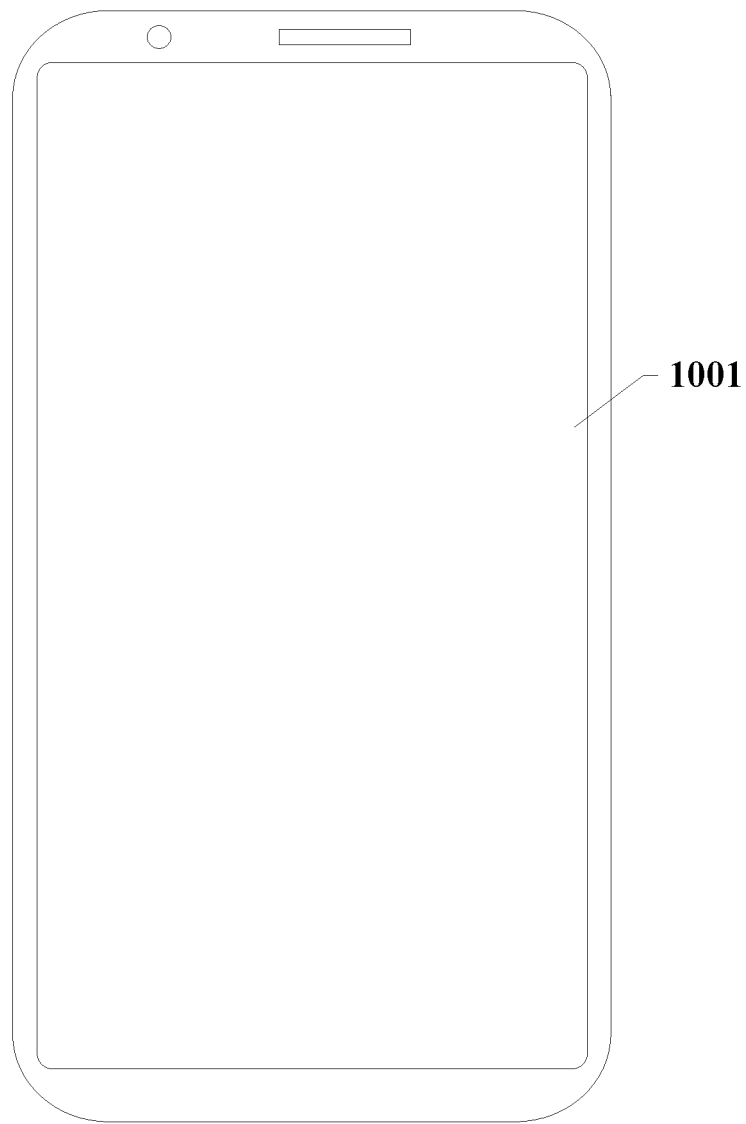
FIG. 20 is a schematic structural view of a display device according to an exemplary embodiment of the present disclosure.

Referring to FIG. 20, FIG. 20 is a schematic structural diagram of a display device according to an exemplary embodiment of the present disclosure. A display device 1000 provided in FIG. 20 includes a display panel 1001 provided by any of the above embodiments of the present disclosure.

One embodiment of the present disclosure is a description of the display device 1000 by using a mobile phone as an example. It can be understood that the display device provided by the embodiment of the present disclosure may be a computer, a television, an in-vehicle display device, or the like, having other display functions and fingerprint recognition functions. The display device is not specifically limited in the present disclosure. The display device provided by the embodiment of the present disclosure has the beneficial effects of the display panel provided by the embodiments of the present disclosure. For details, refer to the detailed description of the display panel in the foregoing embodiments, and details are not described herein again.

It can be seen from the above embodiments that the display panel and the display device provided by the present disclosure achieve at least the following beneficial effects.

The display panel includes a first substrate, a second substrate, and a liquid crystal layer sandwiched between the first substrate and the second substrate. An optical sensor is disposed in the first substrate, and the optical sensor is a photosensitive device and can convert an optical signal into an electrical signal. A black matrix is disposed in the second substrate, and a light collecting structure is disposed on a side of the black matrix adjacent to the first substrate. The light collecting structure has a function of converging light, and includes at least one transparent protrusion. The at least one transparent protrusion is made of a material having a high light transmittance, is equivalent to a convex lens, and has a function of converging light to increase light intensity of light irradiated to the optical sensor. The greater the intensity of the sensed light of the optical sensor, the more sensitive the optical sensor, and the larger the corresponding converted current signal. A larger current signal facilitates reception and recognition, which improves the accuracy of fingerprint recognition and improves the user experience.

Of course, the implementation of any of the products of the present disclosure does not necessarily require to simultaneously achieve all of the technical effects described above.

While the present disclosure has been described in detail with reference to the above embodiments of the present disclosure, it is understood that it will be appreciated by those skilled in the art that the above embodiments may be modified without departing from the scope of the disclosure. The scope of the present disclosure is defined by the appended claims.

What is claimed is:

1. A display panel, comprising:
 a first substrate, a second substrate, and a liquid crystal layer between the first substrate and the second substrate, wherein:
 the first substrate comprises a first base substrate and an optical sensor disposed on the first base substrate;
 the second substrate comprises a second base substrate, a black matrix disposed on the second base substrate, a color resist layer located on the side of the black matrix adjacent to the first substrate, and a light collecting structure disposed on a side of the black matrix adjacent to the first substrate, wherein the light collecting structure is disposed between the color resist layer and the liquid crystal layer;

the optical sensor and the light collecting structure overlap each other in a direction perpendicular to the display panel;

the light collecting structure comprises at least one transparent protrusion, each of the at least one transparent protrusion including an angled corner, pointing to and protruding into the liquid crystal layer along a direction from the second substrate to the first substrate; and a refractive index of the light collecting structure is larger than a refractive index of the liquid crystal layer.

2. The display panel according to claim 1, wherein:
a vertical cross-section of the at least one transparent protrusion is a first pattern, and the vertical cross-section is perpendicular to a surface of the second base substrate; and
the first pattern comprises the angled corner, the angled corner including a sharp corner or a rounded corner, and the sharp corner or the rounded corner protrudes toward the first substrate.

3. The display panel according to claim 2, wherein:
an angle of the sharp corner is α, 70°≤α<130°.

4. The display panel according to claim 2, wherein:
the rounded corner comprises a first side, a second side, and an arc connecting the first side and the second side; and
an angle between the first side and the second side is β, 70°≤β<130°.

5. The display panel according to claim 1, wherein:
the light collecting structure comprises a plurality of transparent protrusions, and a recess is between two adjacent transparent protrusions of the plurality of transparent protrusions; and
a surface of the transparent protrusion is a convex surface, and a surface of the recess is a concave surface.

6. The display panel according to claim 1, wherein:
the refractive index of the light collecting structure is N1, 1.4≤N1≤1.9.

7. The display panel according to claim 1, wherein:
the display panel comprises a display area and a non-display area surrounding the display area, and a portion of the black matrix in the display area is a grid shape; and
the black matrix comprises a plurality of first portions extending in a first direction and a plurality of second portions extending in a second direction, and the first portions and the second portions intersect.

8. The display panel according to claim 7, wherein:
an orthographic projection of the light collecting structure on the second base substrate is a grid shape.

9. The display panel according to claim 7, further including:
a plurality of the light collecting structures, and an orthographic projection of the light collecting structure on the second base substrate is a strip shape; and
the orthographic projection of the light collecting structure on the second base substrate extends in the first direction or in the second direction.

10. The display panel according to claim 1, wherein:
the second substrate further comprises a plurality of support pillars, located on the side of the black matrix adjacent to the first substrate, and the light collecting structure and the plurality of support pillars are made of a same material and located in a same film layer.

11. The display panel according to claim 1, wherein:
the second substrate further comprises an insulating layer, the insulating layer is located between the light collecting structure and the color resist layer.

12. The display panel according to claim 1, wherein:
the first substrate further comprises an array layer, a planarization layer, a pixel electrode layer, and a common electrode layer, disposed on a side of the first base substrate adjacent to the second substrate, and the array layer comprises a plurality of thin film transistors; and
the optical sensor is located on a side of the first base substrate away from the second substrate.

13. The display panel according to claim 1, wherein:
the optical sensor comprises a first switch and a photodiode.

14. The display panel according to claim 1, wherein:
an orthographic projection of the black matrix on the second base substrate completely covers an orthographic projection of the light collecting structure on the second base substrate.

15. The display panel according to claim 1, wherein:
a reflective layer is disposed on a side of the black matrix away from the second base substrate.

16. The display panel according to claim 1, wherein:
the first substrate further comprises an array layer, a planarization layer, a pixel electrode layer, and a common electrode layer, disposed on a side of the first base substrate adjacent to the second substrate, and the array layer comprises a plurality of thin film transistors;
the optical sensor comprises a first switch and a photodiode, the first switch is located in the array layer, the photodiode comprises a PN junction, and the PN junction comprises an N-type semiconductor region and a P-type semiconductor region; and
an active layer of the first switch is multiplexed into the N-type semiconductor region, and the P-type semiconductor region is located on a side of the N-type semiconductor region away from the first base substrate.

17. The display panel according to claim 1, wherein:
the light collecting structure further comprises recess portions, wherein the at least one transparent protrusion together is sandwiched between the recess portions in a direction parallel to the display panel.

18. A display device, comprising:
a display panel, comprising:
a first substrate, a second substrate, and a liquid crystal layer between the first substrate and the second substrate, wherein:
the first substrate comprises a first base substrate and an optical sensor disposed on the first base substrate;
the second substrate comprises a second base substrate, a black matrix disposed on the second base substrate, a color resist layer located on the side of the black matrix adjacent to the first substrate, and a light collecting structure disposed on a side of the black matrix adjacent to the first substrate, wherein the light collecting structure is disposed between the color resist layer and the liquid crystal layer;
the optical sensor and the light collecting structure overlap each other in a direction perpendicular to the display panel;
the light collecting structure comprises at least one transparent protrusion, each of the at least one transparent protrusion including an angled corner, pointing to and protruding into the liquid crystal layer along a direction from the second substrate to the first substrate; and a refractive index of the light collecting structure is larger than a refractive index of the liquid crystal layer.

\* \* \* \* \*